United States Patent
Murillo et al.

(10) Patent No.: US 7,203,896 B2
(45) Date of Patent: Apr. 10, 2007

(54) HIGH-EFFICIENCY ERROR DETECTION AND/OR CORRECTION CODE

(75) Inventors: Laurent Murillo, Meylan (FR); Francois Ricodeau, Coppell, TX (US)

(73) Assignee: STMicroelectronics S.A., Montrouge (FR)

( * ) Notice: Subject to any disclaimer, the term of this patent is extended or adjusted under 35 U.S.C. 154(b) by 675 days.

(21) Appl. No.: 10/115,577

(22) Filed: Apr. 2, 2002

(65) Prior Publication Data

US 2003/0046635 A1   Mar. 6, 2003

(30) Foreign Application Priority Data

Apr. 3, 2001   (FR) ................... 01 04508

(51) Int. Cl.
 *H03M 13/00* (2006.01)
(52) U.S. Cl. ..................................... 714/781
(58) Field of Classification Search ............... 714/781
 See application file for complete search history.

(56) References Cited

U.S. PATENT DOCUMENTS 3,623,155 A   11/1971   Hsiao et al. ............. 340/146.1
4,862,463 A   8/1989   Chen ............................. 371/38
4,888,774 A   12/1989   Kosuge et al. ............. 371/38.1
5,774,481 A   6/1998   Meaney et al. ............. 371/40.1

FOREIGN PATENT DOCUMENTS

EP   0 310 220 B1   5/1995

OTHER PUBLICATIONS

Stephen B. Wicker, Error Control Systems for Digital Communication and Storage, Prentice-Hall, 1995.*
Glick, E.W. et al., "Single-Error Correction, Double-Error Detection Code Utilizing Minimum Circuitry," *IBM Technical Disclosure Bulletin*, 15(1):130-134, Jun. 1972.

* cited by examiner

*Primary Examiner*—Joseph D. Torres
(74) *Attorney, Agent, or Firm*—Lisa K. Jorgenson; Robert Iannucci; Seed IP Law Group PLLC

(57) ABSTRACT

A method for determining r error detection bits that can be associated with a word of m bits to be coded, including the step of calculating the product of a vector with m components representative of the word of m bits to be coded and of a parity control matrix of dimension r×m. The parity control matrix is such that each column of matrix includes an odd number of "1s" greater than or equal to three. The present invention also relates to a method for determining a syndrome.

11 Claims, 9 Drawing Sheets

$$H = \begin{pmatrix} 0 & 0 & 0 & 0 & 0 & 0 & 0 & 0 & 0 & 0 & 0 & 1 & 1 & 1 & 1 & 1 \\ 0 & 0 & 0 & 0 & 1 & 1 & 1 & 1 & 1 & 1 & 1 & 0 & 0 & 0 & 0 & 0 \\ 0 & 1 & 1 & 1 & 0 & 0 & 0 & 1 & 1 & 1 & 1 & 0 & 0 & 0 & 1 & 1 \\ 1 & 0 & 1 & 1 & 0 & 1 & 1 & 0 & 0 & 1 & 1 & 0 & 1 & 1 & 0 & 0 \\ 1 & 1 & 0 & 1 & 1 & 0 & 1 & 0 & 1 & 0 & 1 & 1 & 0 & 1 & 0 & 1 \end{pmatrix}$$

*Fig. 1A*

$$\begin{pmatrix} C_0 \\ C_1 \\ C_2 \\ C_3 \\ C_4 \end{pmatrix} = H * \begin{pmatrix} X_0 \\ X_1 \\ \vdots \\ X_{15} \end{pmatrix}$$

*Fig. 1B*

$$H' = \begin{pmatrix} 0 & 0 & 0 & 0 & 0 & 0 & 0 & 0 & 0 & 1 & 1 & 1 & 1 & 1 & 1 & 0 & 0 & 0 & 0 \\ 0 & 0 & 0 & 0 & 1 & 1 & 1 & 1 & 1 & 1 & 0 & 0 & 0 & 0 & 0 & 1 & 0 & 0 & 0 \\ 0 & 1 & 1 & 1 & 0 & 0 & 0 & 1 & 1 & 1 & 1 & 0 & 0 & 0 & 1 & 1 & 0 & 0 & 1 & 0 & 0 \\ 1 & 0 & 1 & 1 & 0 & 1 & 1 & 0 & 0 & 1 & 1 & 0 & 1 & 1 & 0 & 0 & 0 & 0 & 0 & 1 & 0 \\ 1 & 1 & 0 & 1 & 1 & 0 & 1 & 0 & 1 & 0 & 1 & 1 & 0 & 1 & 0 & 1 & 0 & 0 & 0 & 0 & 1 \end{pmatrix}$$

overbrace: $H$

Fig. 2A $$S = \begin{pmatrix} S_0 \\ S_1 \\ S_2 \\ S_3 \\ S_4 \end{pmatrix} = H' * \begin{pmatrix} X_r \\ C_r \end{pmatrix}$$

Fig. 2B $$H'' = \begin{pmatrix} 0 & 0 & 0 & 0 & 0 & 0 & 0 & 0 & 0 & 0 & 1 & 1 & 1 & 1 & 1 & 0 & 0 & 0 & 0 & 0 \\ 0 & 0 & 0 & 0 & 1 & 1 & 1 & 1 & 1 & 1 & 0 & 0 & 0 & 0 & 0 & 1 & 0 & 0 & 0 & 0 \\ 0 & 1 & 1 & 1 & 0 & 0 & 0 & 1 & 1 & 1 & 1 & 0 & 0 & 0 & 1 & 1 & 0 & 0 & 1 & 0 & 0 \\ 1 & 0 & 1 & 1 & 0 & 1 & 1 & 0 & 0 & 1 & 1 & 0 & 1 & 1 & 0 & 0 & 0 & 0 & 1 & 0 & 0 \\ 1 & 1 & 0 & 1 & 1 & 0 & 1 & 0 & 1 & 0 & 1 & 1 & 0 & 1 & 0 & 1 & 0 & 0 & 0 & 1 & 0 \\ 1 & 1 & 1 & 1 & 1 & 1 & 1 & 1 & 1 & 1 & 1 & 1 & 1 & 1 & 1 & 1 & 1 & 1 & 1 & 1 & 1 \end{pmatrix}$$

with $H'$ marked on the top rows and $D$ marked on the bottom row.

*Fig. 3A*

$$S' = \begin{pmatrix} S_0 \\ S_1 \\ S_2 \\ S_3 \\ S_4 \\ S_5 \end{pmatrix} = H'' * \begin{pmatrix} X_r \\ C_r \\ P \end{pmatrix}$$

*Fig. 3B*

$$M = \begin{Bmatrix} 1 & 0 & 1 & 1 & 0 & 1 & 1 & 1 & 0 & 0 & 0 & 1 & 1 & 1 & 0 & 0 \\ 1 & 1 & 0 & 1 & 1 & 0 & 1 & 0 & 1 & 0 & 1 & 0 & 1 & 0 & 1 & 0 \\ 1 & 1 & 1 & 0 & 1 & 1 & 0 & 0 & 0 & 1 & 1 & 1 & 0 & 0 & 0 & 1 \\ 0 & 0 & 0 & 0 & 0 & 0 & 0 & 0 & 0 & 1 & 1 & 1 & 1 & 1 & 1 \\ 0 & 0 & 0 & 0 & 1 & 1 & 1 & 1 & 1 & 1 & 0 & 0 & 0 & 0 & 0 & 0 \\ 0 & 1 & 1 & 1 & 0 & 0 & 0 & 1 & 1 & 1 & 0 & 0 & 0 & 1 & 1 & 1 \end{Bmatrix}$$

with columns labeled A0, A1, A2, A3, A4, A5 (top) and B0, B1, B2, B3, B4, B5 (bottom).

*Fig. 4A*

$$M' = \begin{Bmatrix} 1 & 0 & 1 & 1 & 0 & 1 & 1 & 1 & 0 & 0 & 0 & 1 & 1 & 1 & 0 & 0 & 1 & 0 & 0 & 0 & 0 & 0 \\ 1 & 1 & 0 & 1 & 1 & 0 & 1 & 0 & 1 & 0 & 1 & 0 & 1 & 0 & 1 & 0 & 0 & 1 & 0 & 0 & 0 & 0 \\ 1 & 1 & 1 & 0 & 1 & 1 & 0 & 0 & 0 & 1 & 1 & 1 & 0 & 0 & 0 & 1 & 0 & 0 & 1 & 0 & 0 & 0 \\ 0 & 0 & 0 & 0 & 0 & 0 & 0 & 0 & 0 & 1 & 1 & 1 & 1 & 1 & 1 & 0 & 0 & 0 & 1 & 0 & 0 \\ 0 & 0 & 0 & 0 & 1 & 1 & 1 & 1 & 1 & 1 & 0 & 0 & 0 & 0 & 0 & 0 & 0 & 0 & 0 & 0 & 1 & 0 \\ 0 & 1 & 1 & 1 & 0 & 0 & 0 & 1 & 1 & 1 & 0 & 0 & 0 & 1 & 1 & 1 & 0 & 0 & 0 & 0 & 0 & 1 \end{Bmatrix}$$

with sections labeled M and C across the top.

HIGH-EFFICIENCY ERROR DETECTION AND/OR CORRECTION CODE

BACKGROUND OF THE INVENTION

1. Field of the Invention

The present invention relates to error detection and/or correction codes, and in particular to linear codes of Hamming type.

2. Description of the Related Art

The Hamming code is an error detection and correction code used in many fields, for example for data storage or transmission. Its use for the storage of data in a memory will be described, in the case where the data to be stored are in the form of 16-bit words.

Let X be the word to be stored. X can be represented by a vector Xe, the 16 components $X_0$ to $X_{15}$ of which correspond to the 16 bits of the word to be stored. Five error detection bits $C_i$ ($C_0 \ldots C_4$) are obtained by multiplying a parity control matrix H, called a Hamming matrix, of dimensions 5×16, by vector Xe in the form of a column vector.

FIG. 1A illustrates Hamming matrix H for 16 bits and FIG. 1B illustrates how to obtain the detection bits. Calling $h_{ij}$ the elements of matrix H, the error detection bits Ci are given by:

$$C_i = \sum_{j=0}^{15} h_{ij} \cdot X_j$$

$X_j$ being the j-th component of vector Xe.

In write mode, 21-bit words, formed of the 16 data bits $X_j$ and of the 5 detection bits $C_i$, are written into the memory. In read mode, the read word includes 16 bits $X_r$ corresponding to the data bits and 5 bits $C_r$ corresponding to the detection bits. It is possible for $X_r$ and $C_r$ not to be equal to $X_j$ and $C_i$ if errors occur during transmission.

To detect and/or correct possible errors on the read bits, a syndrome S with five components $S_0, \ldots S_4$ is calculated by multiplying a determined matrix H' of dimensions 5×21 by a column vector with 21 components, including the 16 bits $X_r$ and the 5 received bits $C_r$.

FIG. 2A illustrates matrix H'. The first 16 columns of matrix H' correspond to the 16 columns of matrix H. The 5 following columns each include a single "1". The 17-th column has its "1" on the first line, the 18-th column has its "1" on the second line, and so on until the 21rst column, which has its "1" on the fifth line. The last five columns of matrix H' are used to determine possible errors in the detection bits.

FIG. 2B illustrates the calculation of syndrome S.

If syndrome S has all its components equal to 0, the storage occurs with no error and all the bits of the read word, be they data bits or detection bits, are correct.

If S is different from 0, the read word includes one or several errors. If a single bit of the read word is erroneous, the obtained syndrome enables correcting the error. Indeed, the obtained syndrome corresponds in this case to the column having had its elements multiplied by the erroneous bit. Thus, if the calculated syndrome is equal to:

$$S = \begin{pmatrix} 0 \\ 0 \\ 0 \\ 1 \\ 1 \end{pmatrix},$$

the components (00011) of the syndrome correspond to the elements of the first column of the Hamming matrix, which means that the first bit, $X_0$, is erroneous.

Similarly, if the calculated syndrome is equal to:

$$S'' = \begin{pmatrix} 1 \\ 0 \\ 0 \\ 0 \\ 0 \end{pmatrix},$$

and there is a single error in the read word, this means that the first detection bit $C_0$ is erroneous.

A disadvantage of the above Hamming code is that it cannot detect two errors. For example, if an error has occurred on bits $X_1$ and $X_2$, the obtained syndrome is equal to the sum modulo 2 of the syndromes corresponding to errors on $X_1$ and $X_2$, that is, to: S'''=(00101)+(00110)= (00011). The obtained syndrome indicates an error on bit $X_0$, which is wrong.

Indeed, the Hamming code is known to have a minimum code distance d=3 and a linear code like the Hamming code is known to be able to correct L errors and to detect L+1 errors if its minimum code distance d is strictly greater than 2L+1.

To improve the above code and turn it into a code having a minimum code distance equal to 4, it is known to add to the word to be stored a total parity bit P.

Total parity bit P is calculated by adding modulo 2 all the data bits and all the detection bits. The parity bit is added to the word to be stored, and the word to be stored, the detection bits, and the total parity bit are altogether stored.

In read mode, the read word is multiplied by parity control matrix H" shown in FIG. 3A. Matrix H" has one more line and one more column than matrix H'. Matrix H" includes, to the top left, that is, on the first five lines and on the first 21 columns, a block identical to matrix H'. The last line D of matrix H" only includes "is" and the last column of matrix H" only includes "0s", except for the last element of the column which contains a The obtained syndrome S' is illustrated in FIG. 3B. Syndrome S' includes six components S0 to S5, and is obtained by multiplying matrix H" by a column vector including the 22 bits of the read word, formed of the 16 read data bits, followed by the five read detection bits, and by the read total parity bit.

The code thus obtained is a so-called "SEC-DED" code ("Single Error Correction"—"Double Error Detection"). This code can detect two errors in all cases, two errors being indicated by the fact that the last component of the syndrome, S5, is zero while the syndrome is different from the zero vector. However, the above code has the disadvantage of requiring the calculation of total parity bit P. This calculation is long, since it requires adding modulo 2 each of the data bits and of the detection bits. The calculation of the total parity bit cannot be performed in parallel with the detection bits, since its calculation requires the previous knowledge of the detection bits. Accordingly, it must be awaited that all detection bits have been calculated to calculate total parity bit P. This results in a loss of time, as well as in a high number of adders modulo 2.

Another disadvantage of the above-described Hamming code is that the Hamming matrix is neither symmetrical, nor regular. Considering that the elements of a column correspond to the binary representation of a number, the variation of this number is not regular and includes jumps. Such jumps make difficult the forming of a circuit implementing the Hamming code as well as the syndrome decoding, that is, the determination of the erroneous bit.

BRIEF SUMMARY OF THE INVENTION

An embodiment of the present invention provides an error detection and/or correction code of SEC-DED type, that enables correction of one error and detection of two errors, which is simpler than the corresponding Hamming code.

Another embodiment of the present invention provides a method for implementing such an error detection and/or correction code. The method can be implemented in a simple way by an integrated circuit and enables easy decoding.

The method for determining r error detection bits that can be associated with a word of m bits to be coded, including the step of calculating the product of a vector with m components representative of the word of m bits to be coded and of a parity control matrix of dimension r×m. The parity control matrix is such that each column of the matrix includes an odd number of "1s" greater than or equal to three.

According to an embodiment of the present invention, the last r-3 elements of each column of the matrix belong to a first sub-matrix of rank i, the binary representation of the r-3 elements indicating the rank i of the first sub-matrix.

According to an embodiment of the present invention, the first sub-matrixes includes sub-matrixes of dimension (r-3)×1 and sub-matrixes of dimension (r-3)×3. According to an embodiment of the present invention, the first three lines of the parity control matrix include second sub-matrixes, in which the second sub-matrixes include sub-matrixes of dimension 3×1 and sub-matrixes of dimension 3×3, the second sub-matrixes of dimension 3×1 including only "0s" or only "1s", and the second sub-matrixes of dimension 3×3 being either the identity matrix, or its inverse.

According to an embodiment of the present invention, the first second sub-matrix is a sub-matrix of dimension 3×1 only including "1s" and the other first sub-matrixes of dimension 3×1 only include "0s".

According to an embodiment of the present invention, the second sub-matrix of rank i has a number of columns equal to the number of columns of the first sub-matrix of same rank.

According to an embodiment of the present invention, two or several lines and/or columns of the parity control matrix are permuted.

According to an embodiment of the present invention, the number r of the error detection bits is equal to n+2, n being such that the number of bits of the word to be coded can be represented by n bits.

The present invention also relates to a method for determining a syndrome representative of possible errors having occurred, in a processing, to an m+r-bit word, the m+r bits corresponding, before processing, to m bits of a word to be coded and r error detection bits applied to the m-bit word to be coded, the syndrome being obtained in a step of multiplying a specific matrix of dimension r×(m+r) by a vector with m+r components representative of the m+r-bit word. The specific matrix includes for the first m columns, a block of dimension r×m corresponding to the parity control matrix used in the coding, and for the last r columns, a block of dimension r×r in the form of a diagonal matrix, including only "1s" on its main diagonal and "0s" everywhere else.

The foregoing objects, features and advantages of the present invention will be discussed in detail in the following non-limiting description of specific embodiments in connection with the accompanying drawings.

BRIEF DESCRIPTION OF THE SEVERAL VIEWS OF THE DRAWINGS

FIGS. 1A and 1B, previously described, respectively show a Hamming matrix H and how to obtain detection bits to code a 16-bit word;

FIGS. 2A and 2B, previously described, respectively show a Hamming matrix H' for calculating a syndrome and the syndrome calculation mode for a 16-bit word;

FIGS. 3A and 3B, previously described, respectively illustrate a Hamming matrix H" used in a code enabling detection of two errors for 16-bit words and the corresponding syndrome calculation mode;

FIG. 4A shows a parity control matrix M according to the present invention for coding a 16-bit word;

FIG. 4B shows a matrix M' according to the present invention for decoding a 16-bit word;

FIGS. 5A and 5B respectively show a parity control matrix M2 according to the present invention for coding a 32-bit word and a matrix M'2 for decoding a word coded by means of matrix M2;

DETAILED DESCRIPTION OF THE INVENTION

Figure 4C:
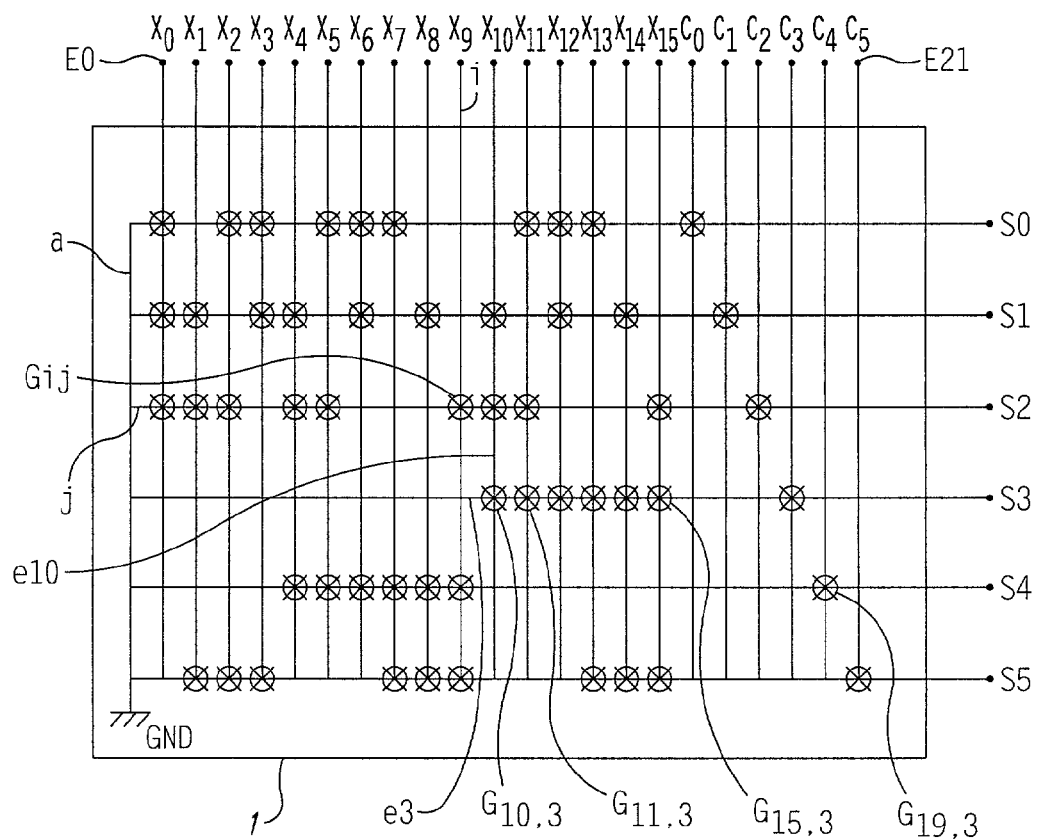
FIG. 4C schematically shows a circuit for decoding a word coded by means of matrix M.

FIG. 4A illustrates a parity control matrix M enabling coding 16-bit words. Matrix M is a matrix of dimension 6×16.

The first three lines of matrix M are formed by six sub-matrixes Ai, i representing the position of the sub-matrix and ranging from 0 to 5. Sub-matrix A0 includes a single column which includes only "1s". The next sub-matrixes are square sub-matrixes of dimension 3×3. Sub-matrixes A1, A2, and A4 are identical. They include 0s on their main diagonal and 1s everywhere else. Sub-matrixes A3 and A5 are identical. They include 1s on their main diagonal and 0s everywhere else. Sub-matrixes A3 and A5 correspond to identity matrix I and sub-matrixes A1, A2, and A4 to the inverse of the identity matrix, Ī.

The last three lines of matrix M are formed by six sub-matrixes Bi, i representing the position of the sub-matrix and ranging from 0 to 5. Each sub-matrix Bi is located under the matrix Ai of same rank and has the same number of columns. All the columns of a matrix Bi are identical. The binary representation of a column of sub-matrix Bi indicate the rank i of the sub-matrix. Thus, for example, sub-matrix B0 includes a single column formed of elements "000" and each of the three columns of sub-matrix B4 is formed of elements "100", which is a binary representation of number 4.

Each column of matrix M is different from the other columns of matrix M. The columns of matrix M are linearly independent two by two, that is, the sum modulo 2 of any two columns of matrix M does not provide a column of matrix M. Further, each of the columns of matrix M only includes three "1s".

To code a 16-bit word, 6 detection bits C0 to C5 are first determined by multiplying matrix M by a column vector having as components the bits of the word to be coded. Then, the 6 detection bits are assigned to the 16 bits of the word to be coded and all this is stored.

FIG. 4B shows matrix M' used to decode words coded by means of matrix M. At the decoding, the read word is a 22-bit word, formed of 16 data bits and of 6 detection bits.

Matrix M' is a matrix of dimension 6×22. Matrix M' is formed of two blocks. A first block, to the left, forming the first 16 columns of matrix M', is identical to matrix M. A second block C, to the right, representing the last 6 columns of matrix M', is a square diagonal matrix of dimension 6×6 which includes only "1s" on its main diagonal and "0s" everywhere else. All columns of matrix M' are different from one another and linearly independent two by two.

The code implemented by means of matrixes M and M' is a code of SEC-DED type, that is, enabling correction of one error and detection of two errors. At the decoding, matrix M' is multiplied by a column vector having as components the data and detection bits of the read word. The result of this multiplication is a syndrome appearing in the form of a column vector having six components, S0 to S5.

If the obtained syndrome is the zero vector (all its components are equal to zero), there is no error, neither on the data bits, nor on the detection bits. If the obtained syndrome is not the zero vector and the syndrome parity is odd ($S0 \oplus S1 \oplus S2 \oplus S3 \oplus S4 \oplus S5=1$), there is a single error. This error can be corrected, the syndrome components corresponding to the column of matrix M' which has been multiplied by the erroneous bit. It should be noted that, since the binary representation of the elements of a sub-matrix Bi corresponds to the rank of the sub-matrix, the search for the erroneous bit is very simplified as compared to prior art. If the obtained syndrome is not the zero vector and the parity of the syndrome is even, two errors have occurred and are detected.

FIG. 4C schematically shows a circuit 1 for calculating the preceding syndrome. On 22 inputs E0 to E21, the circuit receives the 16 read data bits X0 to X15 and the 6 read detection bits C0 to C5. The circuit includes 6 outputs S0 to S5 providing the six syndrome components. Each input Ei is connected to a column of rank i of the circuit. Each output Sj is connected to a line of rank j. At the intersection of column i and of line j, there can be an adder modulo 2 $G_{i,j}$ indicated by a circle marked with a cross. The adders are for example formed by XOR gates.

Figure 4D:
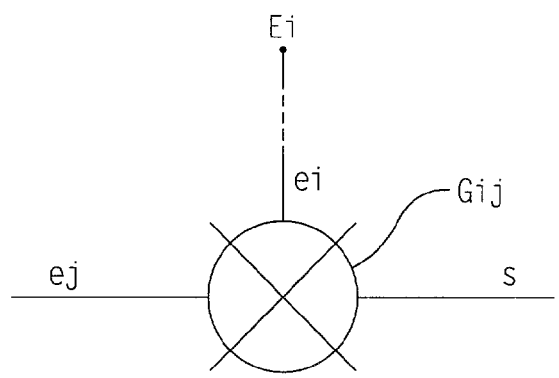
FIG. 4D shows an element of the circuit of FIG. 4C.

As shown in FIG. 4D, adder $G_{i,j}$ includes two inputs ei and ej. Input ei is connected to input Ei and input ej receives the signal present on line j to the left of adder $G_{i,j}$. Adder $G_{i,j}$ also includes an output s located on line j to the right of adder $G_{i,j}$.

When there is no adder at the intersection of column i and of line j, this means that column i and line j cross with no influence upon each other. This means that the bit provided to the involved input is not used to calculate component Sj of the syndrome. An additional column a, located to the left of column 0, connects input ej of each first adder of a line to ground (GND).

The operation of the decoding circuit will be explained for the calculation of component S3 of the syndrome, corresponding to the line of rank 3. Starting from the left, the first encountered adder is adder $G_{10,3}$. Input e3 of adder $G_{10,3}$ is connected to ground and its input e10 receives data bit X10 via input E10 of the circuit. At the output of adder $G_{10,3}$, $s=0 \oplus X10$, that is, X10. The signal provided by adder $G_{10,3}$ drives input e3 of adder $G_{11,3}$, which calculates $X10 \oplus X11$. The calculation carries on in this way until adder $G_{19,3}$ is reached, which adds modulo 2 the result provided by adder $G_{15,3}$ and detection bit C3. Thus:

$$S3=X10 \oplus X11 \oplus X12 \oplus X13 \oplus X14 \oplus X15 \oplus C3,$$

which effectively corresponds to the multiplication of the fourth line of matrix M' by a vector having as components the bits of the read word. Generally, the decoding circuit of FIG. 4C uses the structure of matrix M', the lines and columns of the circuit corresponding to the lines and columns of matrix M', an adder modulo 2 being placed where matrix M' includes a 1.

In the code described in relation with FIGS. 4A to 4D, it is useless to calculate a total parity bit to detect two errors, conversely to prior art. All the syndrome components can be calculated in parallel, which saves time. The pattern formed by the adders is rather repetitive, which favors the circuit forming. The circuit used for the coding has not been shown. It corresponds to the decoding circuit, except for the last six columns, which are suppressed. The outputs of the coding circuit provide the detection bits.

Of course, it is possible to generalize the coding and decoding of the present invention to words having more than 16 bits.

Figure 5A:
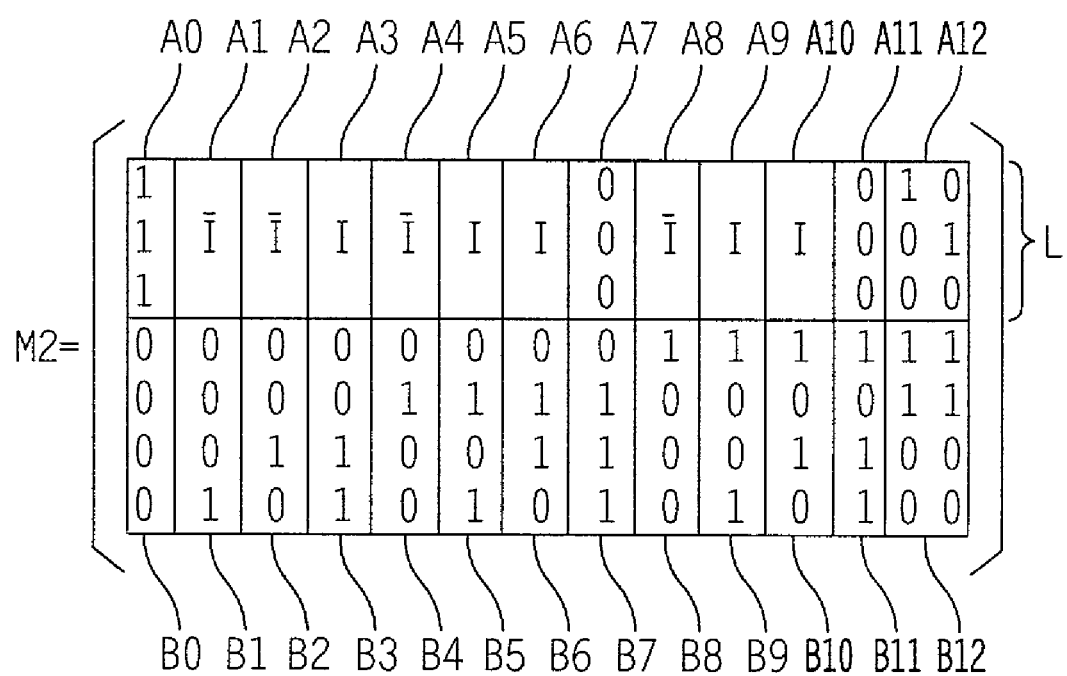

FIG. 5A illustrates a parity control matrix M2 for coding 32-bit words. In the description of the forming of matrix M2, the general principles used to form the parity control matrix according to the present invention will be discussed.

Generally, in the code according to the present invention, each column of the parity control matrix includes an odd number of "1s" greater than or equal to 3. Generally again, although this is not necessary, all possible column combinations includes three "1s" will first be formed, followed by the combinations including five "1s", and so on if necessary.

To form a parity control matrix according to the present invention, the number of necessary detection bits, which determines the dimension of the parity control matrix, is first determined. Generally, the number of detection bits used in the present code is equal to n+2, $2^n$ representing a number greater than or equal to the number of bits of the word to be coded. Thus, in the preceding example for 16 bits, $16=2^4$, which provides a number of detection bits equal to $4+2=6$. In the present example, 32 is equal to $2^5$. There are thus 7 detection bits and parity control matrix M2 has dimension 7×32.

Then a block L of the matrix formed by the first three lines is isolated. Block L will be divided into sub-matrixes Ai. According to what is appropriate, sub-matrixes Ai will be column sub-matrixes formed of elements "111" or "000" or of the square sub-matrixes of dimension 3×3 corresponding to identity matrix I or to its inverse Ī. If need be, the last sub-matrix of block L is incomplete.

Under block L are n−1 lines, the elements of which form the columns of sub-matrixes Bi. The elements of a column of any sub-matrix Bi are identical to the elements of the other columns of sub-matrix Bi, if they exist, and their binary representation indicates the rank i of the sub-matrix. The sub-matrixes Ai and Bi of same rank are located one above the other and have a same number of columns.

The forming of matrix M2 of FIG. 5A will now be detailed, insisting on the choice between one and three columns for sub-matrixes Bi. In FIG. 5A, when a sub-matrix Bi includes three columns, a single column is shown, for clarity.

The first sub-matrix Bi is sub-matrix B0 of rank 0. Sub-matrix B0 is a column sub-matrix and all its elements are zeros. Since at least three "1s" per column are desired to be obtained, a column sub-matrix A0 of type "111" must be placed above sub-matrix B0. Sub-matrix B0 necessarily includes a single column since it is impossible to have a configuration including three "1s" and ending with "0000" other than configuration "1110000".

Thus, sub-matrixes B1 and A1, of rank 1, are determined. The elements of a column of sub-matrix B1 having to represent the rank of the sub-matrix, a column of sub-matrix B1 is formed of elements "0001". Since three "1s" are desired for each column of matrix M2, a column of sub-matrix B1 must be topped with three elements, two of which are "1s" and one of which is a "0". This corresponds to three possible combinations and sub-matrix B1 will include three columns. Sub-matrix B1 is topped with sub-matrix A1, of dimension 3×3. Each column of sub-matrix A1 must include two "1s" per column. All columns of sub-matrix A1 must further be different and linearly independent two by two. Since the columns of the inverse matrix of the identity matrix fulfill these criteria, said matrix will be chosen as matrix A1.

Then, sub-matrix B2 has three identical columns formed of elements "0010", the binary representation of which is number 2. Above the three columns of matrix B2, a matrix A2 is placed, which is again the inverse of the identity matrix, Ī, since this matrix includes two "1s" for each column.

The three columns of sub-matrix B3 are formed of elements "0011". Since each column of sub-matrix B3 here includes two "1s", a sub-matrix A3 including a single "1" in each column is placed above sub-matrix B3, the columns of sub-matrix A3 being different and linearly independent two by two. Identity matrix I, which fulfills these criteria, is chosen as sub-matrix A3.

Of course, any two columns of sub-matrixes A1, A2, or A3 may be permuted while remaining within the framework of the present invention. Generally speaking, actually, any permutation of two or more lines or columns of a parity control matrix according to the present invention provides a code having the same effects and advantages as those described.

Sub-matrixes B4, B5, and B6 are formed according to the preceding principles. They each include three columns, respectively including elements "0100", "0101", and "0110". The corresponding sub-matrixes A4, A5, and A6 are respectively formed by matrixes Ī, I and I. The first 19 columns of matrix M2 are so defined.

The next matrix, B7, has a single column. Indeed, the binary representation of number 7 is "0111". This binary representation already includes three "1s". Since it is desired that all columns of matrix M2 first include all possible combinations having three "1s" only, sub-matrix B7 will have one column only and the elements of sub-matrix A7 will be chosen to be equal to "000".

Sub-matrixes B8, B9, and B10 each have three columns of respective elements "1000", "1001", "1010" and the corresponding sub-matrixes A8, A9, and A10 respectively are matrixes Ī, I and I.

The binary representation of number 11 is "1011". Since this binary representation already includes three "1s", sub-matrix B11 has a single column. The corresponding column sub-matrix A11 has elements "000", since all possible combinations of three "1s" are first desired to be used for the columns of matrix M2.

Thirty columns of matrix M2 are already coded. There only remain two columns to be determined. These two columns correspond to a sub-matrix B12, each column of which has expression "1100". Above, a sub-matrix A12 formed of a portion only of identity matrix I will be placed. In FIG. 5A, the first two columns of identity matrix I have been taken, but any two columns of identity matrix I could of course be taken without departing from the field of the present invention.

Matrix M2 is now entirely formed. All its columns are distinct from one another, linearly independent two by two, and each includes exactly three "1s".

Figure 5B:
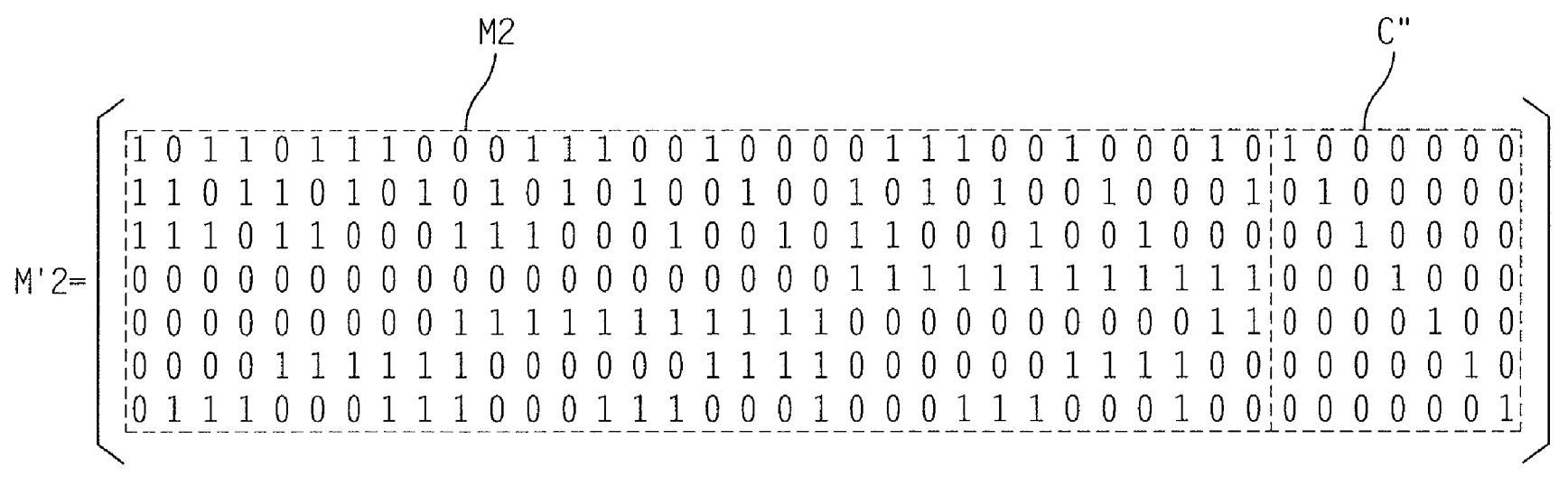

FIG. 5B shows a matrix M'2 used to decode words coded by means of matrix M2. Matrix M'2 is formed of two blocks, a first block of dimension 7×32, to the left and corresponding to matrix M2, followed by a second block C" of dimension 7×7, corresponding to a diagonal matrix with "1s" on the main diagonal and "0s" everywhere else.

As in the preceding case, the code obtained by using matrixes M2 and M'2 is a SEC-DED code, enabling correction of one error and detection of two errors. If the syndrome obtained by multiplying matrix M'2 by the read word is the zero vector, there is no error. If the obtained syndrome is not the zero vector and the syndrome parity is odd, there is a single error that can be corrected, the syndrome components corresponding to the column of matrix M'2 which has been multiplied by the erroneous bit. If the obtained syndrome is not the zero vector and the syndrome parity is even, two errors have occurred and are detected.

Up to now, only parity control matrixes including exactly three "1s" per column have been formed. However, if longer words are desired to be coded, all three-bit combinations may be used, and combinations including five "1s" per column will then be used.

Table 1 hereafter indicates the number of detection bits used according to the number of bits of the word to be coded, the dimension of the parity control matrix used in the coding, the number of possibilities of columns with three "1s", and the number of columns having to include five "1s".

TABLE 1

| Number of bits of the word to be coded ($2^n$) | Number of detection bits (n + 2) | Matrix dimension | Number of possibilities with three "1s" per column | Number of columns including five "1s" |
|---|---|---|---|---|
| $16 = 2^4$ | 6 | 6 × 16 | 6 × 5 × 4/3! = 20 > 16 | 0 |
| $32 = 2^5$ | 7 | 7 × 32 | 7 × 6 × 5/3! = 35 > 32 | 0 |
| $64 = 2^6$ | 8 | 8 × 64 | 8 × 7 × 6/3! = 56 | 8 |
| $128 = 2^7$ | 9 | 9 × 128 | 9 × 8 × 7/3! = 84 | 44 |

The number of possibilities of columns with three "1s" is provided by formula: $(n-2)(n-1)n/3!$, with $3! = 3 \times 2 = 6$. In table 1, it can be seen that for 16 and 32 bits, the possibilities of columns including three "1s" are greater than the number of columns of the parity control matrix. Accordingly, it is useless to use columns including five "1s" to build these matrixes. For 64-bit words to be coded, 8 detection bits are required and each column in the parity control matrix includes 8 elements. The total number of columns with three "1s" is equal to 56. Accordingly, the 56 possibilities offered for columns with three "1s" will be used, which will be completed by 64−56=8 columns including five "1". For 128-bit words, 9 detection bits are used. The parity control matrix is of dimension 9×128. The total number of different columns including three "1s" is equal to 84 and the parity control matrix will have to be completed with 44 columns including five "1s".

As an example, to illustrate how these columns including five "1s" are introduced, the forming of the parity control matrix according to the present invention will be explained for 64-bit words. It should be noted that, if it was desired to code words including a very large number of bits, it is possible, after using all combinations of columns with five "1s", to create columns including seven "1s", etc., since the present invention is not limited to columns including three or five "1s".

Figure 6A:
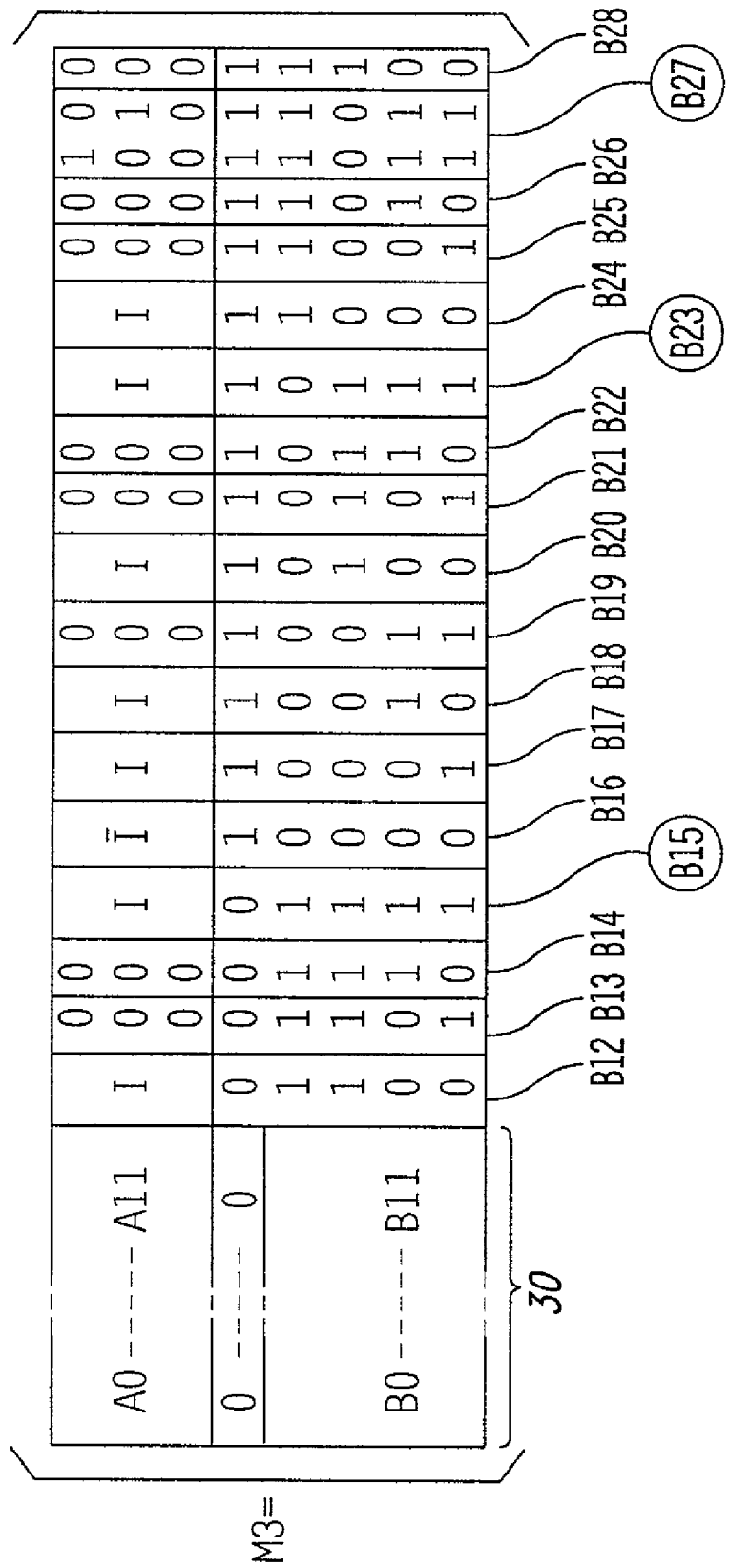
FIG. 6A shows a parity control matrix M3 according to the present invention for coding a 64-bit word.

FIG. 6A shows a parity control matrix M3 according to the present invention intended to code 64-bit words. The number of detection bits is equal to 8 and matrix M3 has dimension 8×64. The first 32 columns of matrix M3 correspond to the columns of matrix M2, except that each of the first 32 columns of matrix M3 includes 8 elements instead of 7, the fourth element of each column being an additional element equal to 0. In FIG. 6A, the first 30 columns of matrix M3 have not been shown in detail. They include, on the first three lines, sub-matrixes A0, . . . A11 of matrix M2. Then, still only considering the first thirty columns, there is a fourth line including only "0s". Below, the last four lines include sub-matrixes B0 to B11 of matrix M2.

The next two columns, that is, the columns of rank 30 and 31, correspond to the last two columns of matrix M2. Here, however, sub-matrix B12 is a sub-matrix of dimension 5×3, in which the elements of a column are "01100". Sub-matrix B12 is topped with identity matrix I of dimension 3×3, so that each of columns 31, 32, and 33 of matrix M3 includes three "1s". The rest of matrix M3 is formed according to the principles described in relation with the preceding examples.

Thus, sub-matrix B13 only has one column of elements "01101", topped with three "0s", since there already are three "1s" in the binary expression of number 14. Then, comes column sub-matrix B14 of elements "01110", also topped with three "0s".

To form sub-matrix B15, number 15 is first expressed in binary form, which gives "01111". For the first time, four "1s" are present in a column of a sub-matrix Bi. Since an odd number of "1s" per column is desired, a sub-matrix A15 equal to identity matrix I will be placed above matrix B15.

Then comes sub-matrix B16, the column of which has expression "10000", topped with matrix I, to have three "1s" per column. Sub-matrixes B17, B18, and B20 include two "1s" per column. Sub-matrixes B17, B18, and B20 have three columns each and are topped with corresponding sub-matrixes Ai equal to identity matrix I. Sub-matrixes B19, B21, and B22 have columns including three "1s". Sub-matrixes B19, B21, and B22 have a single column each, topped with a sub-matrix Ai having elements "000".

The next sub-matrix, B23, has three columns expressed as "10111", which include four "1s", like sub-matrix B15. For the corresponding columns of matrix M3 to include five "1s", a sub-matrix A23 equal to identity matrix I is placed on sub-matrix B23. Matrix M3 now includes six columns with five "1s". In FIG. 6A, the references of sub-matrixes Bi surrounded with a circle are those corresponding to columns of matrix M3 including five "1s".

The next sub-matrix B24 has three columns expressed as "11000". It is topped with identity matrix I. The next sub-matrix B25 has a single column expressed as "11001". It is topped with three "0s". The next sub-matrix B26 has a single column expressed as "11010". It is topped with a column sub-matrix A26 having elements "000".

The next sub-matrix B27 has columns of which the expression, "11011", includes four "1s". Since it has been seen, in relation with table 1, that 8 columns including five "1s" were necessary and that 6 columns with five "1s" are already present, sub-matrix B27 will be incomplete and will only include two columns. They will be topped with any two columns of identity matrix I. For example, in FIG. 6A, the first two columns of the identity matrix have been taken, that is, "100" and "010".

Sub-matrix B27 is followed by sub-matrix B28 including a single column expressed as "11100", topped with "000". The 64 columns of matrix M3 are now formed. The columns of matrix M3 are all different, linearly independent two by two, and include either three "1s", or five "1s". All combinations of columns with three "1s" have been used.

In the forming of matrix M3 of FIG. 6A, the total number of columns with five "1s" to be used has had to be remembered, to be sure to use all possible combinations of columns with three "1s" only. Thus, sub-matrix B27 has been incomplete and has included two columns only, to enable the last possibility with three "1s" ("00011100") to be present in matrix M3. However, the code according to the present invention could very well have used a complete matrix B27, topped with identity matrix I, and not have used the last possibility offered by the combinations with three "1s". Such a code also belongs to the present invention.

Figure 6B:
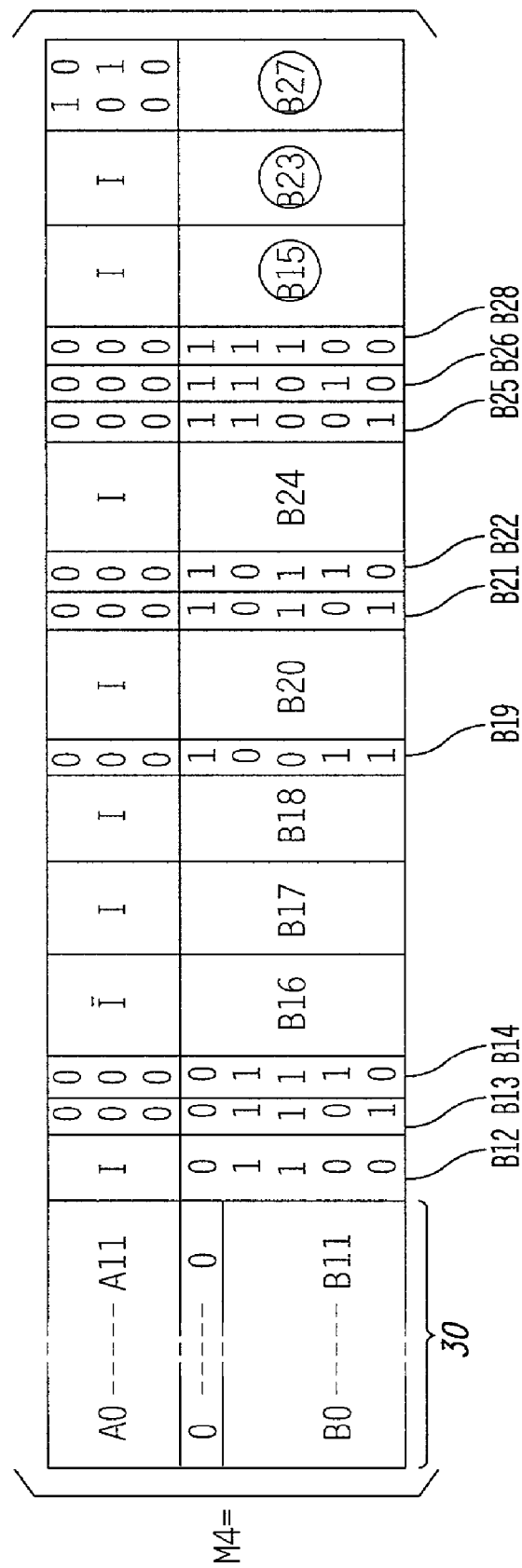
FIG. 6B shows an alternative of matrix M3.

If it is desired to avoid keeping in mind the number of necessary possibilities with five elements, a matrix M4 is formed, still to code 64-bit words, as described in relation with FIG. 6B.

In FIG. 6B, same references designate same elements as in FIG. 6A. Matrix M4 uses the first 35 columns of matrix M3, that is, the columns including sub-matrixes B0 to B14. Sub-matrix B15 is identical to that of FIG. 6A, but it is not placed after sub-matrix B14, since it includes four "1s". Sub-matrix B15 is put aside and will be placed after all combinations with three "1s" have been used. Thus, the sub-matrix following sub-matrix B14 is sub-matrix B16. The next sub-matrixes are sub-matrixes B17, B18, B19, B20, B21, and B22. The sub-matrix Bi following sub-matrix B22 is sub-matrix B24, since sub-matrix B23 includes four "1s" and is temporarily put aside. Sub-matrix B24 is followed by sub-matrixes B25, B26, and B28, sub-matrix B27 being put aside. With column sub-matrix B28, all possibilities of columns including three "1s" have been used. This amounts to 56 columns, as appears in table 1. The sub-matrixes Bi temporarily put aside are then placed, to form the remaining columns of matrix M4. The three columns of sub-matrix B15, the three columns of sub-matrix B23, and two columns of sub-matrix B27 are thus placed, to form the 64 columns of matrix M4. By so operating, the last formed sub-matrix is, if necessary, incomplete and it is not necessary to keep in mind the number of columns including five "1s" to use all the possibilities of columns with three "1s".

It should be noted that in each of the codes of the present invention, it is useless to calculate a total parity bit, and that the formed matrixes exhibit repetitive patterns, favoring the implementation of coding and decoding circuits.

Of course, the present invention is likely to have various alterations, modifications, and improvements which will readily occur to those skilled in the art. In particular, any permutation of two or several columns and/or lines of a parity control matrix according to the present invention results in an equivalent code within the field of the present invention.

The number of bits of the word to be coded is not necessarily a multiple of two. It may also be smaller than 16. For example, the word to be coded may be a 7-bit word.

It should be noted that, above an incomplete matrix Bi, any one or two columns of identity matrix I or of its inverse Ī may be used, according to the case. Thus, if the incomplete matrix Bi includes a single column, any column of sub-matrixes I or Ī may be retained. If the incomplete sub-matrix Bi includes two columns, any two columns of sub-matrixes I or Ī may be retained.

It should also be noted that it is possible to use other combinations of columns with three or five "1s" than those described in relation with FIGS. 4A to 6B. Thus, any 16 possibilities may be chosen from among the 20 possibilities of columns with three "1s" to code a 16-bit word, without necessarily using the choice made in relation with FIG. 4A.

It should also be noted that the code according to the present invention applies to any field in which error correction and/or detection codes are used, for example for transmission.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit-implemented method for encoding a word of m bits to be coded, comprising:
   determining r error detection bits by calculating the product of a vector with m components representative of the word of m bits to be coded and of a parity control matrix of dimension r×m, wherein the parity control matrix has lines and columns such that each column of said matrix includes an odd number of "1s" greater than or equal to three, wherein the last r−3 lines of the parity control matrix form a plurality of first sub-matrixes each having one or more columns, each column of each first sub-matrix including r−3 elements that form a binary representation of a position of the first sub-matrix within the parity control matrix; and
   encoding the word using the r error detection bits.

2. The method of claim 1 wherein a first one of the first sub-matrixes is a sub-matrix of dimension (r−3)×1 and a second one of the first sub-matrixes is a sub-matrix of dimension (r−3)×3.

3. The method of claim 1 wherein the first three lines of the parity control matrix include second sub-matrixes, in which the second sub-matrixes include sub-matrixes of dimension 3×1 and sub-matrixes of dimension 3×3, the second sub-matrixes of dimension 3×1 including only "0s" or only "1s", and the second sub-matrixes of dimension 3×3 being either the identity matrix, or its inverse.

4. The method of claim 3 wherein a first of the second sub-matrixes is a sub-matrix of dimension 3×1 only including "1s" and wherein the other second sub-matrixes of dimension 3×1 only include "0s".

5. The method of claim 3 wherein each second sub-matrix corresponds to a respective one of the first sub-matrixes, has a number of columns equal to the number of columns of the corresponding first sub-matrix, and the column or columns of the second sub-matrix and the corresponding first sub-matrix are parts of the same column or columns of the parity control matrix.

6. The method of claim 1 wherein the number r of the error detection bits is equal to n+2, n being the smallest number such that $2^n$ is greater than or equal to m.

7. The method of claim 1 wherein the parity control matrix has m columns, wherein each column includes a first group of three bits and a second group of r−3 bits constituting a binary representation of a rank i of the column, the parity control matrix including:
   one column in which i=0;
   three columns in which i=1; three columns in which i2;
   m−7 columns in which i=3 if m−7 is less than 3 and greater than zero, zero columns in which i=3 if m−7 is zero or less, and three columns in which i=3 if m−7 is 3 or greater;
   m−10 columns in which i=4 if m−10 is less than 3 and greater than zero, zero columns in which i=4 if m−10 is zero or less, and three columns in which i4 if m−10 is 3 or greater;
   m−13 columns in which i=5 if m−13 is less than 3 and greater than zero, zero columns in which i=5 if m−13 is zero or less, and three columns in which i5 if m−13 is 3 or greater;
   m−16 columns in which i=6 if m−16 is less than 3 and greater than zero, zero columns in which i=6 if m−16 is zero or less, and three columns in which i=6 if m−16 is 3 or greater;
   one column in which i=7 if m is greater than or equal to 20 and zero columns in which i=7 if m is less than 20;
   m−20 columns in which i=8 if m−20 is less than 3 and greater than zero, zero columns in which i=8 if m−20 is zero or less, and three columns in which i8 if m−20 is 3 or greater;
   m−23 columns in which i=9 if m−23 is less than 3 and greater than zero, zero columns in which i=9 if m−23 is zero or less, and three columns in which i9 if m−23 is 3 or greater;
   m−26 columns in which i=1 0 if m−26 is less than 3 and greater than zero, zero columns in which i=10 if m−26 is zero or less, and three columns in which i10 if m−26 is 3 or greater;
   one column in which i=11 if m is greater than or equal to 30 and zero columns in which i=11 if m is less than 30; and
   m−30 columns in which i=12 if m−30 is less than 3 and greater than zero, zero columns in which i=12 if m−30 is zero or less, and three columns in which i=12 if m−30 is 3 or greater.

8. The method of claim 7 wherein the columns that share the same rank are positioned adjacent to one another in the parity control matrix.

9. The method of claim 7 wherein the first groups for each set of three columns sharing the same rank i form either the identity matrix or an inverse of the identity matrix.

10. The method of claim 9 wherein for each set of three columns sharing the same rank i, the first groups form the identity matrix if the binary representation of the rank i has an even number of "1s" and the first groups form the inverse of the identity matrix if the binary representation of the rank i has an odd number of "1s".

11. The method of claim 7 wherein the first group for the column having a rank i of zero consists of three "1s" and, for the columns having a rank whose binary representation has exactly three "1s", the first groups consist of three "0s".

* * * * *

UNITED STATES PATENT AND TRADEMARK OFFICE
CERTIFICATE OF CORRECTION

PATENT NO. : 7,203,896 B2  
APPLICATION NO. : 10/115577  
DATED : April 10, 2007  
INVENTOR(S) : Laurent Murillo et al.

Page 1 of 1

It is certified that error appears in the above-identified patent and that said Letters Patent is hereby corrected as shown below:

<u>Column 12</u>  
Line 10, "three columns in which i2" should read as -- three columns in which i=2 --.

Lines 15-16, "m-10columns in which i=4 if m-10is less than 3 and greater than zero," should read as -- m-10 columns in which i=4 if m-10 is less than 3 and greater than zero, --.

Lines 17-18, "and three columns in which i4 if m-10is 3 or greater;" should read as -- and three columns in which i=4 if m-10 is 3 or greater --.

Lines 21-22, "and three columns in which i5 if m-13 is 3 or greater;" should read as -- and three columns in which i=5 if m-13 is 3 or greater; --.

Lines 32-33, "and three columns in which i8 if m-20 is 3 or greater;" should read as -- and three columns in which i=8 if m-20 is 3 or greater; --.

Lines 36-37, "and three columns in which i9 if m-23 is 3 or greater;" should read as -- and three columns in which i=9 if m-23 is 3 or greater; --.

Lines 38-39, "m-26 columns in which i=1 0 if m-26 is less than 3 and greater than zero," should read as -- m-26 columns in which i=10 if m-26 is less than 3 and greater than zero, --.

Lines 40-41, "and three columns in which i10 if m-26 is 3 or greater;" should read as -- and three columns in which i=10 if m-26 is 3 or greater; --.

Signed and Sealed this

First Day of July, 2008

JON W. DUDAS  
*Director of the United States Patent and Trademark Office*